US007499501B2

(12) United States Patent
Chung et al.

(10) Patent No.: US 7,499,501 B2
(45) Date of Patent: Mar. 3, 2009

(54) SYMBOL ERROR BASED COMPENSATION METHODS FOR NONLINEAR AMPLIFIER DISTORTION

(75) Inventors: Wonzoo Chung, Kent, WA (US); Christopher D. Long, Maple Valley, WA (US); Thomas J. Endres, Seattle, WA (US)

(73) Assignee: Omereen Wireless, LLC, Dover, DE (US)

( * ) Notice: Subject to any disclaimer, the term of this patent is extended or adjusted under 35 U.S.C. 154(b) by 538 days.

(21) Appl. No.: 11/109,464

(22) Filed: Apr. 18, 2005

(65) Prior Publication Data

US 2005/0243946 A1    Nov. 3, 2005

Related U.S. Application Data

(60) Provisional application No. 60/562,716, filed on Apr. 16, 2004.

(51) Int. Cl.
H04B 1/38    (2006.01)
(52) U.S. Cl. .................................... 375/297; 455/114.3
(58) Field of Classification Search ................. 375/285, 375/295–297; 330/149; 455/63.1, 570, 114.2, 455/114.3
See application file for complete search history.

(56) References Cited

U.S. PATENT DOCUMENTS

| | | | |
|---|---|---|---|
| 5,900,778 A | | 5/1999 | Stonick |
| 6,075,813 A | * | 6/2000 | Chen et al. .................. 375/216 |
| 6,144,705 A | * | 11/2000 | Papadopoulos et al. ...... 375/296 |
| 6,433,835 B1 | | 8/2002 | Hartson |
| 6,677,870 B2 | * | 1/2004 | Im et al. ...................... 341/110 |
| 6,885,241 B2 | * | 4/2005 | Huang et al. ................. 330/149 |
| 6,999,523 B2 | * | 2/2006 | Posti .......................... 375/296 |
| 7,061,990 B2 | * | 6/2006 | Wright et al. ................ 375/296 |
| 7,061,991 B2 | * | 6/2006 | Wright et al. ................ 375/296 |
| 2001/0009572 A1 | * | 7/2001 | Mochizuki ................... 375/296 |
| 2003/0053552 A1 | * | 3/2003 | Hongo et al. ................ 375/295 |
| 2003/0112370 A1 | | 6/2003 | Long et al. |

OTHER PUBLICATIONS

"NTSC Video Measurements", Tektronix, Inc., 1997, 38 pgs.
Karam, G. et al., "Generalized Data Predistortion Using Intersymbol Interpolation", Philips Journal of Research, 1991, pp. 1-22, vol. 46, No. 1, Elsevier Science Publishers Ltd., Essex, United Kingdom.
Roos et al., "Theory and Aigorithms for Linear Optimization", 1997, John Wiley & Son.

* cited by examiner

*Primary Examiner*—Khanh C Tran
(74) *Attorney, Agent, or Firm*—Perkins Coie LLP

(57) ABSTRACT

Compensation methods and apparatus are disclosed for mitigating non-linear distortion of high power amplifiers used in communication transmitters, based on the minimization of the symbol error, in particular, for communication systems transmitting data embedded in existing co-channel signals. To overcome the difficulty of constructing pre-distortion mapping from the symbol error, an adaptive algorithm is disclosed to update compensation parameters for pre-distortion mapping. Another method exploits a test signal interval in the co-channel signal. During a known constant co-channel signal, distortion is estimated as a complex number and used to construct compensation parameters. The latter is further expanded by employing the adaptive algorithm for the non-test signal intervals.

15 Claims, 11 Drawing Sheets

PA Compensation System Block Diagram – Single Source Case 1

Prior Art PA Compensation System Block Diagram – Single Source Case 1

PA Compensation System Block Diagram – Single Source Case 1

Alternative PA Compensation System Block Diagram – Single Source

PA Compensation System Block Diagram – Multiple Sources

Data PA Compensator Block Diagram

107 Compensation Estimator - Method 1
Compensation Estimator Block

First Alternative Compensation Estimator Block

Second Alternative Compensation Estimator Block

The Magnitude of Co-channel Signal with an Ideal Test Signal Interval

Curve fitting method for the Amplitude Compensation Vector

PLL Tracking Error Compensation Block Diagram

SYMBOL ERROR BASED COMPENSATION METHODS FOR NONLINEAR AMPLIFIER DISTORTION

CROSS-REFERENCE TO RELATED APPLICATION(S)

This application claims the benefit of U.S. Provisional Patent Application No. 60/562,716, filed on Apr. 16, 2004. It is also related to U.S. patent application Ser. No. 09/062,225, filed Apr. 17, 1998, now U.S. Pat. No. 6,433,835, Issued Aug. 13, 2002 entitled "EXPANDED INFORMATION CAPACITY FOR EXISTING COMMUNICATION TRANSMISSION SYSTEMS"; PCT Application No. PCT/US1999/08513, filed Jun. 16, 1999 entitled "EXPANDED INFORMATION CAPACITY FOR EXISTING COMMUNICATION TRANSMISSION SYSTEMS"; U.S. patent application Ser. No. 10/319,671, filed Aug. 9, 2002 entitled "EXPANDED INFORMATION CAPACITY FOR EXISTING COMMUNICATION TRANSMISSION SYSTEMS"; PCT Application No. PCT/US2003/029423, filed Sep. 17, 2003 entitled "ADAPTIVE EXPANDED INFORMATION CAPACITY FOR TELEVISION COMMUNICATIONS SYSTEMS"; U.S. patent application Ser. No. 10/246,084, filed Sep. 18, 2002 entitled "ADAPTIVE EXPANDED INFORMATION CAPACITY FOR COMMUNICATIONS SYSTEMS"; U.S. patent application Ser. No. 10/255,799, filed Sep. 25, 2002 entitled "CABLE TELEVISION SYSTEM COMPATIBLE BANDWIDTH UPGRADE USING EMBEDDED DIGITAL CHANNELS"; and PCT Application No. PCT/US2003/030327, filed Sep. 24, 2003 entitled "CABLE TELEVISION SYSTEM AND METHOD FOR COMPATIBLE BANDWIDTH UPGRADE USING EMBEDDED DIGITAL CHANNELS".

BACKGROUND

Modern digital communication systems have sophisticated data modulation schemes to meet the increasing demand for high information rate in band-limited channels, and consequently require more advanced signal processing techniques to support the high data rates. However, more sophisticated signal processing and modulation schemes are more sensitive to distortions.

One such advanced modulation scheme is a system that expands information capacity of an existing communication system by embedding data in the co-channel signals of an existing infrastructure, described in "Expanded Information Capacity For Existing Communication Transmission Systems" by Hartson et. al. (U.S. Pat. No. 6,433,835), which has been further developed in "Adaptive Expanded Information Capacity For Communication Systems" by Long et. al. (U.S. CIP application Ser. No. 10/246,084). In this system, data signals are inserted in a co-channel analog TV signal, with power levels lower than those of the co-channel signals, and are processed by devices originally designed for the co-channel signals.

The low-power data signals added to dominating co-channel signals face many obstacles. The main obstacle, perhaps, is a non-linear distortion caused by a power amplifier (PA) designed for the co-channel signals rather than for the data signals. Therefore, the throughput of this data-over-co-channel-signal system can be seriously degraded in the presence of the PA distortion. The PA non-linear distortion problem in communication systems has been well recognized and several compensation schemes have been developed to mitigate it.

In most digital communication systems, information bits are mapped to real-valued (or complex-valued) numbers and converted to a band-limited waveform by a pulse-shaping filter. The pulse-shaped signals are then modulated to a radio frequency (RF) signal and fed to a PA for power amplification before transmission. Due to power efficiency and physical limitations of the amplifying devices, the PA often works outside of its linear region and introduces larger amplitude and phase distortion for the RF signals of large envelope amplitude than for the RF signals of small envelope amplitude—especially in the region close to the PA saturation point.

Because the envelope amplitude of the RF signals is the amplitude of the pulse-shaped signals, the PA non-linear distortion can be modeled in baseband as a memory-less, time-varying amplitude-dependent amplitude distortion (AM/AM) and amplitude-dependent phase distortion (AM/PM) as a function of the amplitude of the pulse-shaped signals.

To mitigate the PA distortion, several DSP techniques have been developed, such as "Adaptive Parametric Signal Predistorter For Compensation Of Time Varying Linear And Nonlinear Amplifier Distortion" by Stonick et.al. (U.S. patent application Ser. No. 852,944). The prior art techniques compare the pulse-shaped RF converter input signals and the baseband demodulated signals from PA RF output to generate error signals and to construct a pre-distortion mapping for the RF converter input.

Some schemes first estimate the non-linear characteristics of the PA, based on the comparison error, and then invert the characteristics to obtain pre-distortion mapping, for example "Generalized Data Predistortion Using Intersymbol Interpolation," by Karam et. al., Philips J. of Research, pp.1-22, vol. 46, no 1, 1991.

Some schemes directly minimize the comparison error by adaptively adjusting the pre-distortion mapping, for example, with a polynomial approximation as described in "Adaptive Parametric Signal Predistorter For Compensation of Time Varying Linear and Nonlinear Amplifier Distortion" by Stonick et.al. (U.S. Pat. No. 5,900,778).

Comparing baseband PA input and output is not applicable to data-over-co-channel-signal systems such as the systems proposed in "Expanded Information Capacity For Existing Communication Transmission Systems" by Hartson et. al. (U.S. Pat. No. 6,433,835) and "Adaptive expanded information capacity for communication systems" by Long et. al. (U.S. CIP application Ser. No. 10/246,084). In most cases, the co-channel signals are already compensated in their own compensation mechanism, independently of the data.

A feasible approach for this system is to directly use the mean squared error (MSE) or the bit error rate (BER) of demodulated data symbols, instead of the intermediate pulse-shaped signals. Unfortunately, one critical drawback inhibiting practical use of this approach is the difficulty of obtaining the pre-distortion mapping from the MSE of the symbol outputs. The MSE function of the symbol outputs does not allow any closed form expression for its gradient with respect to the pre-distortion mapping parameters. Furthermore, regressor vectors are often inaccessible even for the conventional numerical gradient approximations such as simplex algorithms, let alone the prohibitively expensive computational complexity of numerical approaches, such as the ones discussed in "Theory and Algorithms For Linear Optimization" by Roos et. al., John Wiley & Son, 1997.

DETAILED DESCRIPTION

Figure 1:
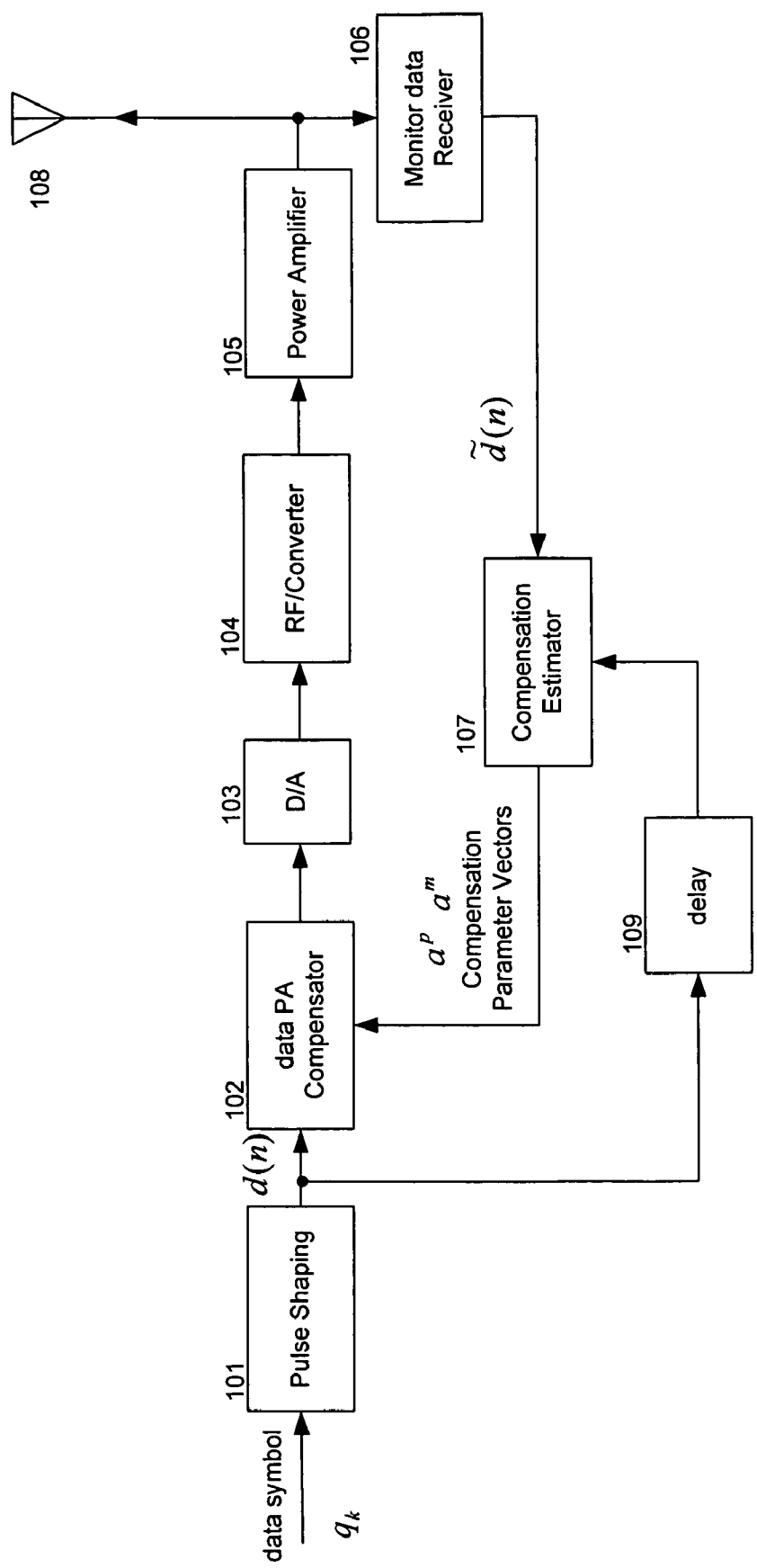
FIG. 1 illustrates a method for mitigating power amplifier non-linear signal distortions in a single source digital communication system, according to the prior art.

Several PA non-linearity compensation methods are described below, based on minimizing MSE of output symbols, and an adaptive algorithm to support these methods. Symbol errors are generated by a reference signal from delayed data input symbols or from hard decisions from a decision device that simplifies a compensation mechanism. Aspects of the invention include at least three non-linear compensation methods for data signals, utilizing MSE of demodulated symbol outputs to generate error signals for non-linear pre-distortion mapping of data signals.

A first method is to adaptively optimize pre-distortion mapping to minimize MSE of symbol outputs, using a stochastic update algorithm named "Fittest Survivor Algorithm (FSA)." The FSA repeatedly disturbs the pre-distortion mapping in two opposite and random directions and chooses a direction minimizing MSE, until the MSE reaches a stable state at a local minimum. This computationally simple FSA can be used in any optimization problem where conventional stochastic gradient methods are not applicable.

A second method, in contrast to the general approach of the first method, is application specific. The second method assumes that (1) digital data is embedded into co-channel signals whose magnitude may dominate the overall signals and that (2) the co-channel signals have a known test signal interval in which the co-channel signals stay constant at a number of fixed values (for example NTC7 composite in NTSC signal as described in "NTSC Video Measurement," Tektronix, Inc., 1997).

Once the co-channel signals are fixed during a test signal interval, a pre-distortion value minimizing output symbol MSE can be determined by simple least-mean-square (LMS) type single parameter estimation. After determining the pre-distortion values for each fixed co-channel signal value, sequentially, the entire pre-distortion mapping is interpolated.

A third method is an extension of the first and the second methods, in that the FSA algorithm is applied to the non-test-signal-interval and the second method is applied to the test-signal-interval. Illustrative embodiments of PA pre-compensation systems and methods are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Overview of the Systems

FIG. 1 illustrates a single source communication system equipped with a prior art PA compensation method of mitigating the non-linear distortion due to PA. Data symbol $\{q_k\}$, drawn from a finite alphabet set consisting of real-valued or complex-valued numbers, is pulse shaped in a pulse-shaping block 101. A data PA compensator block 102 compensates the output of block 101, d(n). The output of the PA compensator block 102 is then converted to an analog signal by a D/A converter 103. The output of the D/A converter 103 is subsequently converted to radio frequency (RF) signals by an RF converter 104, and amplified by a high power amplifier 105.

The output of the PA 105 is transmitted by an antenna 108 while also being fed back into a monitor data receiver 106. The monitor data receiver 106 demodulates the output of PA 105 and produces an estimated pulse-shaped data signal $\tilde{d}(n)$. The estimated pulse-shaped data signal $\tilde{d}(n)$ is further fed back into a compensation estimation block 107. The pulse-shaped data signal d(n), from the pulse-shaping block 101, is delayed by a delay block 109 and is also fed into the compensation estimation block 107.

The compensation estimator block 107 compares the delayed pulse-shaped data d(n) from the pulse-shaping block 101 with the estimated pulse-shaped data $\tilde{d}(n)$ from the monitor receiver block 106 and generates a number of compensation parameters to be used by the PA compensation block 102 to minimize the error between d(n) and $\tilde{d}(n)$.

Figure 2:
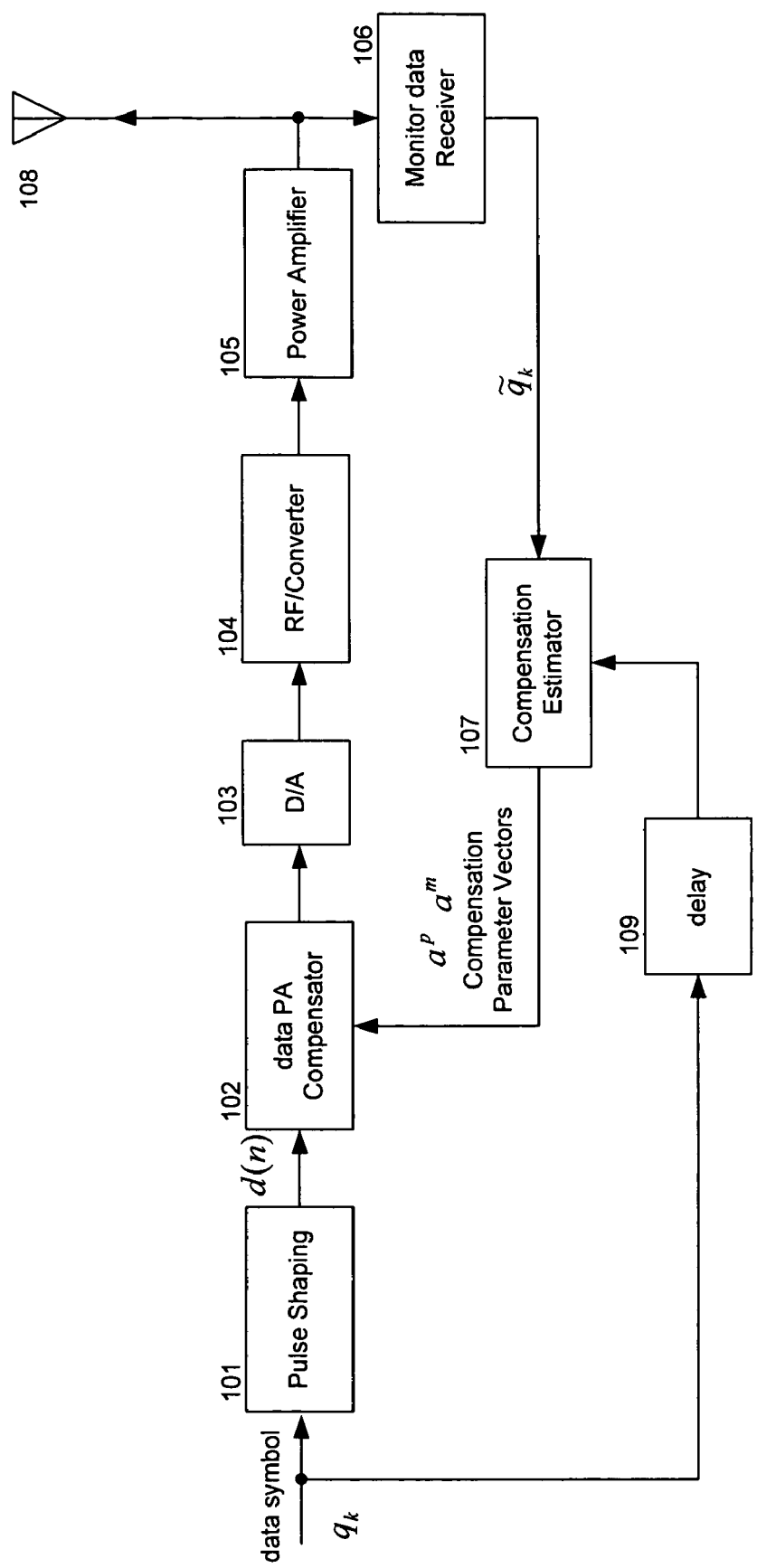
FIG. 2 illustrates a method for mitigating power amplifier non-linear signal distortions in a single source digital communication system, according to an embodiment of the invention.
Figure 3:
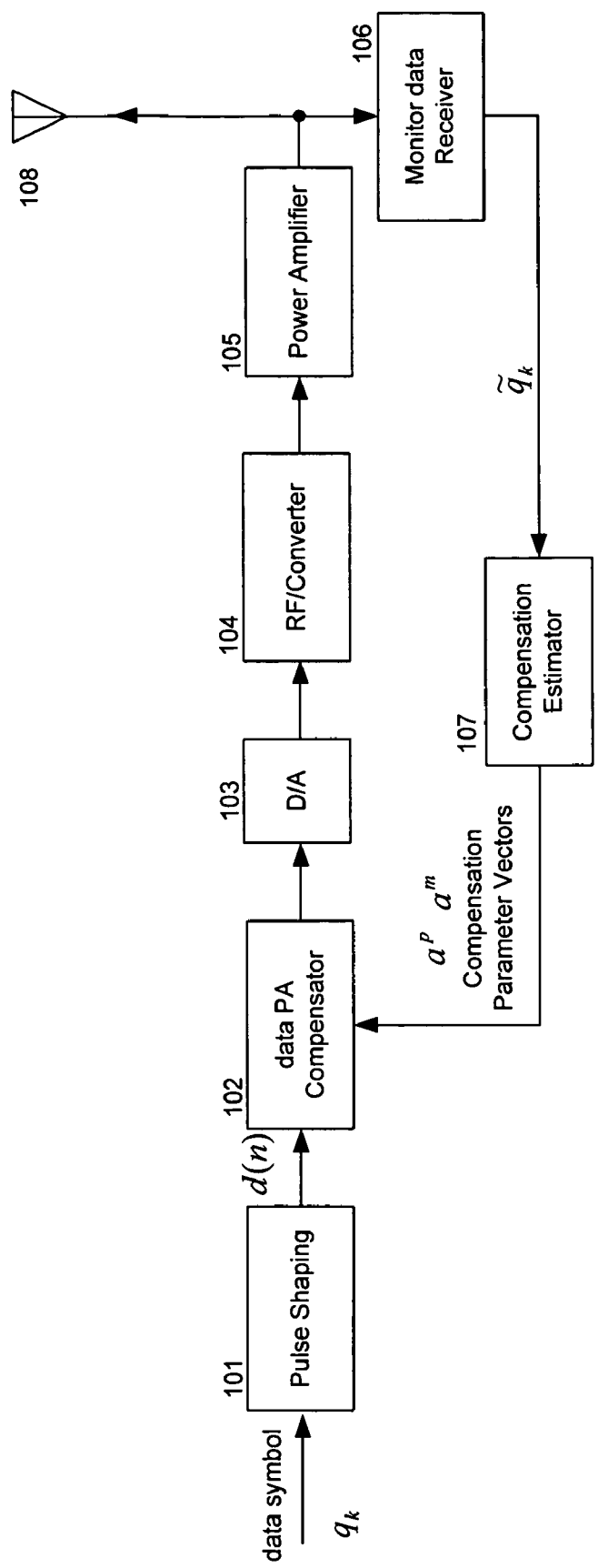
FIG. 3 illustrates a method for mitigating power amplifier non-linear signal distortions in a single source digital communication system, according to an embodiment of the invention, wherein delayed data symbols used for symbol error generation are replaced with decisions.

FIG. 2 illustrates an embodiment of the invention for a single source communication system. In contrast with the system of FIG. 1, the monitor data receiver 106 of FIG. 2 feeds back estimated symbols $\{\tilde{q}_k\}$ instead of the estimated pulse-shaped data signals $\tilde{d}(n)$, and feeds forward the delayed data symbols $\{q_k\}$ instead of the delayed pulse-shaped data signals d(n). As shown in FIG. 2, data-symbols $\{q_k\}$ are delayed by the delay block 109, and are compared with the estimated symbols $\{\tilde{q}_k\}$ from the monitor receiver 106 at the compensation estimator block 107. Since data symbols are drawn from a finite alphabet set, in another embodiment the output of the delay block 109 can be replaced with the hard decisions based on the estimated symbols $\{\tilde{q}_k\}$, which eliminates the delay block 109, as illustrated in FIG. 3. The details of each block will be better understood as different embodiments of the invention are further described below.

Figure 4:
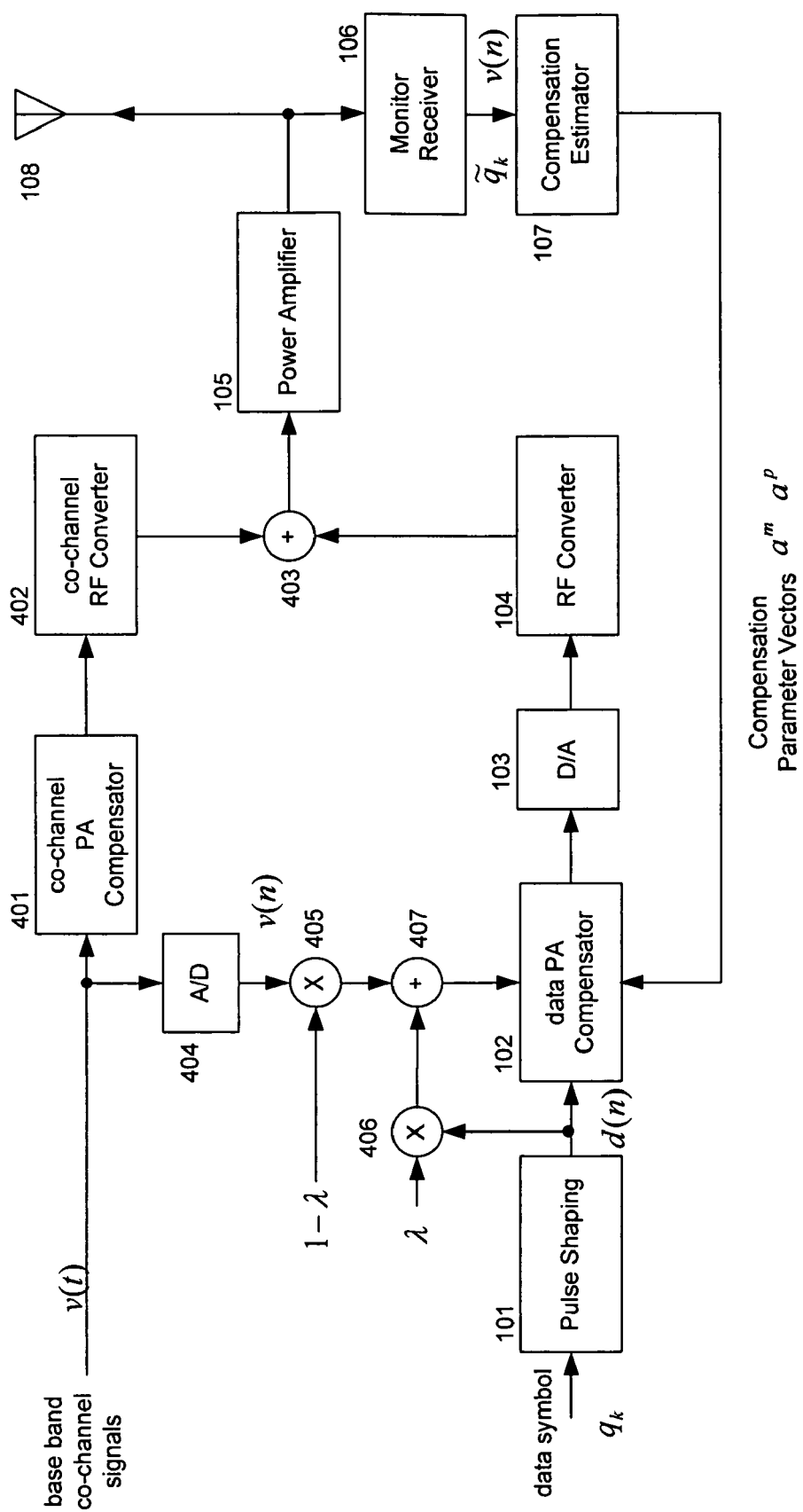
FIG. 4 illustrates a method for mitigating power amplifier non-linear signal distortions in a multi source digital communication system, according to an embodiment of the invention, wherein digital data is embedded into a co-channel signal.

FIG. 4 illustrates a multi source communication system equipped with a PA compensator, in accordance with one embodiment of the invention. The co-channel signal v(t) is an analog signal, generated either by a digital or an analog source. A co-channel PA compensator 401 pre-compensates the co-channel signal. A co-channel RF converter 402 converts the output of the co-channel PA compensator 401 into an RF signal. Data symbols $\{q_k\}$ are processed at the pulse-shaping block 101. The data PA compensator block 102 pre-compensates the output of the pulse-shaping block 101, d(n), with respect to an output of the adder 407. The adder 407 sums a weighted digital co-channel signal, which is an output of a multiplier 405, and a weighted data signal, which is an output of a multiplier 406. The multiplier 405 adjusts a scale of an output of an A/D converter block 404 by $1-\lambda (0 \leq \lambda \leq 1)$, while the multiplier 406 adjusts the scale of the output of the pulse-shaping block 101 by $\lambda (0 \leq \lambda \leq 1)$, where $\lambda$ is an adjustable constant for controllably combining the data and the co-channel signals.

The output of the co-channel RF converter 402 is added to the output of the RF converter block 104 at the adder 403. The output of adder 403 is amplified by the power amplifier 105. The output of power amplifier 105 is transmitted through the antenna 108, while being fed back to the monitor receiver 106, as noted above.

The monitor receiver 106 produces a received data symbol output $\{\tilde{q}_k\}$ and a sampled received co-channel signal $\tilde{v}(n)$. Based on these received signals, the compensation estimator 107 estimates the compensation parameters for the data PA compensator 102. Since co-channel signals are compensated separately, the conventional PA compensation methods described in FIG. 1 are not applicable to this system.

When the power of a co-channel signal dominates the output of the adder 403 and data signal changes have negligible effect on PA distortion, $\lambda$ can be set to zero so that the data PA compensator 102 operates solely on the co-channel signals as reference signals. For a different signal power distribution, $\lambda$ can be adjusted for a substantially optimal performance of the PA compensator 102. Note that if $\lambda=1$, this multi-source system becomes a single-source system as in FIGS. 2 and 3.

Data PA Compensator

Figure 5:
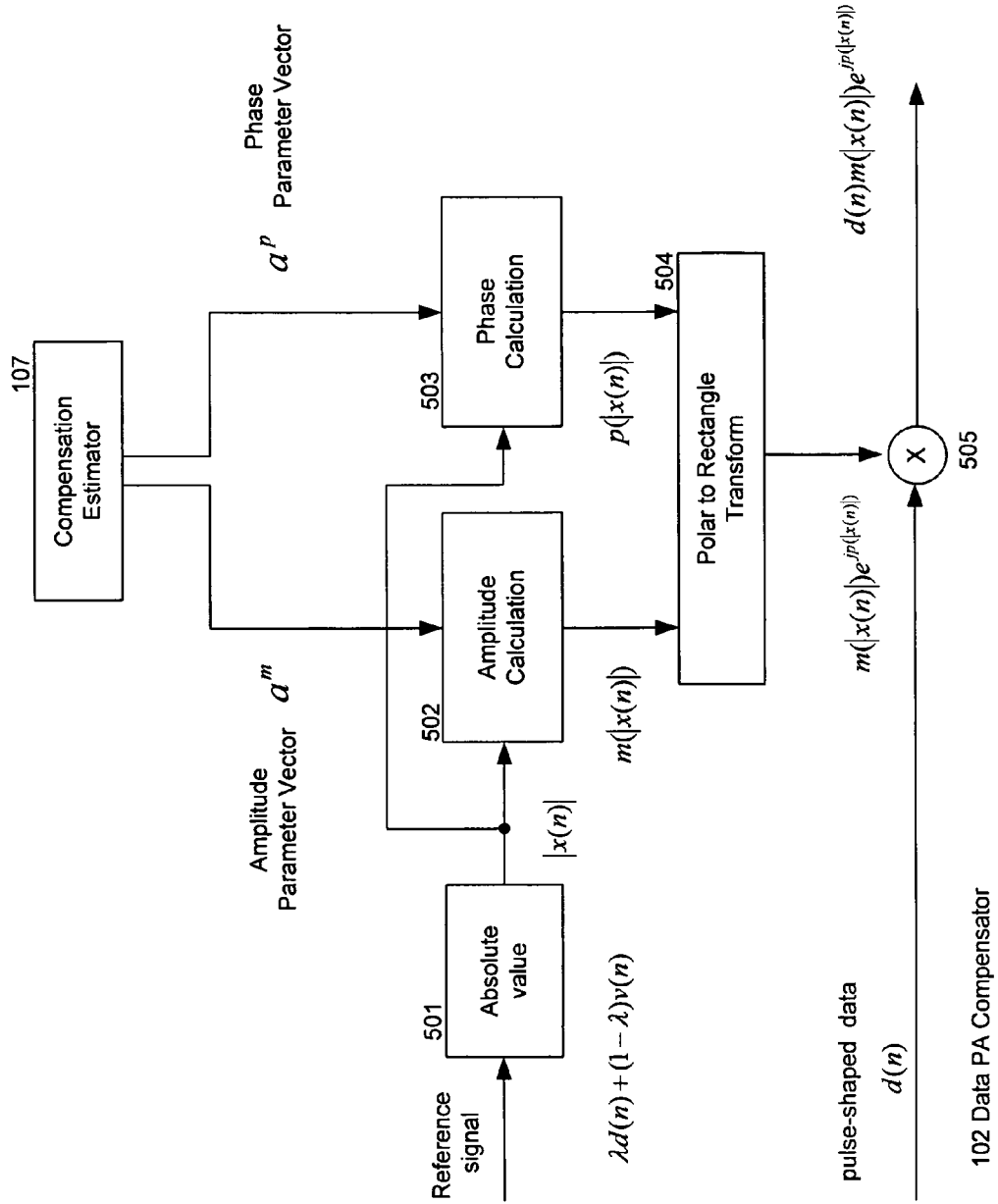
FIG. 5 depicts details of a data-power amplifier-compensator block, in accordance with an embodiment of the invention.

FIG. 5 illustrates a suitable makeup of the data PA compensator block 102 of FIGS. 2, 3, and 4. An output of the adder 407, denoted by x(n), is used as a reference signal, where:

$$x(n) = \lambda d(n) + (1-\lambda)v(n),$$

and where $\lambda=1$ for FIGS. 2 and 3.

An absolute value block 501 computes an amplitude of the output of the adder 407. To generate amplitude and phase compensation, an amplitude calculation block 502 and a phase calculation block 503 use an output of the absolute value block 501. In addition, the amplitude calculation block 502 uses the amplitude parameter vector from the compensation estimator block 107, denoted by $a^m = (a_0^m, \ldots a_{w-1}^m)$, and the phase calculation block 503 uses the phase parameter vector from 107, denoted by $a^p = (a_0^p, \ldots a_{W-1}^p)$. Amplitude and phase calculations employ one of the following methods:

Look-up Table Approach:

$$m(|x(n)|) = a_k^m, \ p(|x(n)|) = a_k^p \text{ when } T_k \leq |x(n)| < T_{k+1},$$

where $\{T_k\}$ is a partition of the interval $[\min(|x(n)|), \max(|x(n)|)]$, and Polynomial Approach:

$$m(|x(n)|) = \sum_{k=0}^{W-1} a_k^m |x(n)|^k, \ p(|x(n)|) = \sum_{k=0}^{W-1} a_k^p |x(n)|^k.$$

In the look-up table approach, elements of the parameter vectors directly approximate a pre-distortion function with a quantization grid $\{T_k\}$. In the polynomial approach the elements of the parameter vectors are used as coefficients of a high order polynomial approximating the pre-distortion function.

The output of the amplitude calculation block 502 and the phase calculation block 503, $m(|x(n)|)$ and $p(|x(n)|)$ respectively, are transformed to a complex number by a polar to rectangle transformer 504. An output of the polar to rectangle transformer 504, $m(|x(n)|)e^{jp(|x(n)|)}$, is multiplied to the data signal d(n) to produce a pre-compensated data output $d(n)m(|x(n)|)e^{jp(|x(n)|)}$ in a multiplier 505.

Fittest Survivor Algorithm (FSA)—Compensation Estimator 1

Figure 6:
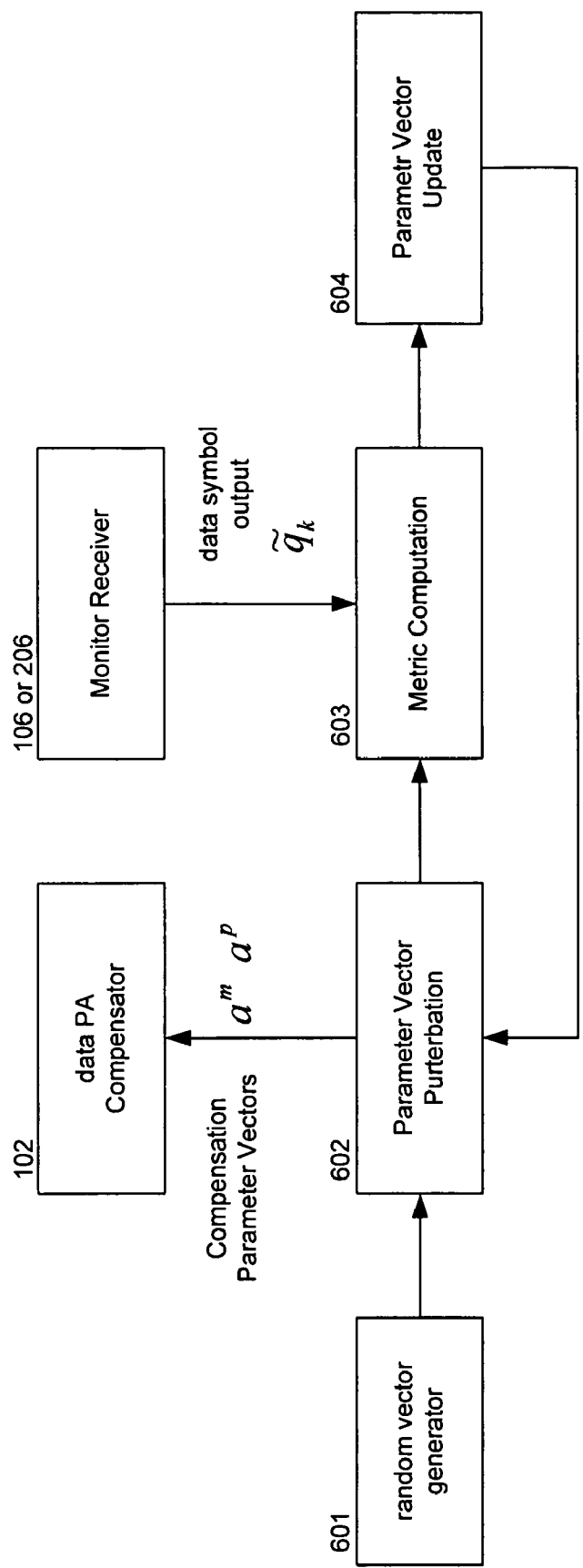
FIGS. 6, 7, and 8 are block diagrams of compensation estimation method, in accordance with different embodiments of the invention.

FIG. 6 describes an embodiment for implementing the compensation estimator block 107. The compensation estimator block 107 estimates the amplitude and phase compensation parameter vectors based on the output of the monitor receiver 106. Three different methods are presented for estimating the compensation parameter vectors.

The first method utilizes the "Fittest Survivor Algorithm (FSA)," which can be applied to stochastic optimization problems, especially those where gradient and/or regressor vectors are not available. At a first iteration of the algorithm, a parameter vector perturbation block 602 starts with initial parameter vectors $a^p(n)$ and $a^m(n)$ at n=0. A random vector generator block 601 generates a vector of the same length as $a^p(n)$ and $a^m(n)$ filled with random numbers. Using the output of the random vector generator 601, denoted by b(n), the parameter vector perturbation block 602 updates the compensation parameter vector in the data PA compensator 102 with each of the following four values for N data symbols.

|  | First N data Symbols | Second N data Symbols | Third N data Symbols | Fourth N data Symbols |
| --- | --- | --- | --- | --- |
| Amplitude | $a^m(n) + \mu_n b(n)$ | $a^m(n) - \mu_n b(n)$ | $a^m(n)$ | $a^m(n)$ |
| Phase | $a^p(n)$ | $a^p(n)$ | $a^p(n) + \mu_n b(n)$ | $a^p(n) - \mu_k b(n)$ | where $\mu_n$ is the step size at the n-th iteration. The parameter vector perturbation block 602 indicates the beginning of each perturbation to a metric computation block 603. The metric computation block 603 accumulates the sum squared decision error J(n) from the monitor receiver data symbol output $\tilde{q}_k$ for the N symbols, for each perturbation:

$$J_{m+}(n) = \sum_{k=0}^{N-1} |\tilde{q}_k - D(\tilde{q}_k)|^2 \text{ (for the first } N \text{ data Symbols)}$$

$$J_{m-}(n) = \sum_{k=N}^{2N-1} |\tilde{q}_k - D(\tilde{q}_k)|^2 \text{ (for the second } N \text{ data Symbols)}$$

$$J_{p+}(n) = \sum_{k=2N}^{3N-1} |\tilde{q}_k - D(\tilde{q}_k)|^2 \text{ (for the third } N \text{ data Symbols)}$$

$$J_{p-}(n) = \sum_{k=3N}^{4N-1} |\tilde{q}_k - D(\tilde{q}_k)|^2 \text{ (for the fourth } N \text{ data Symbols)}$$

where $D(\tilde{q}_n)$ denotes hard decision values from the received symbol output $\tilde{q}_k$ or the originally sent symbols obtained from a training sequence. Since, in most cases, PA distortion is not severe enough for the symbol outputs to deviate from decision boundaries, the hard decision values can be used instead of the training sequence.

Using these four metrics, $J_{m+}(n)$, $J_{m-}(n)$, $J_{p+}(n)$, $J_{p-}(n)$, a parameter vector update block 604 chooses parameter vectors resulting from a lower sum squared error:

$$a^m(n+1) = \begin{cases} a^m(n) + \mu_n b(n) & \text{if } J_{m+}(n) < J_{m-}(n) \\ a^m(n) - \mu_n b(n) & \text{if } J_{m+}(n) \geq J_{m-}(n) \end{cases}$$

$$a^p(n+1) = \begin{cases} a^p(n) + \mu_n b(n) & \text{if } J_{p+}(n) < J_{p-}(n) \\ a^p(n) + \mu_n b(n) & \text{if } J_{p+}(n) \geq J_{p-}(n) \end{cases}$$

and determines the step size for the next iteration:

$$\mu_{n+1} = \mu_n f_\mu(|J_{m+}(n) - J_{m-}(n)|, |J_{p+}(n) - J_{p-}(n)|),$$

where $f_\mu$ is a step size scale function, such as the maximum function $f_\mu(a,b) = \max(a,b)$. Utilizing these updated parameter vectors and the step size, the parameter vector perturbation block 602 starts the next iteration.

Co-Channel Test Signal Method—Compensation Estimator 2

Figure 9:
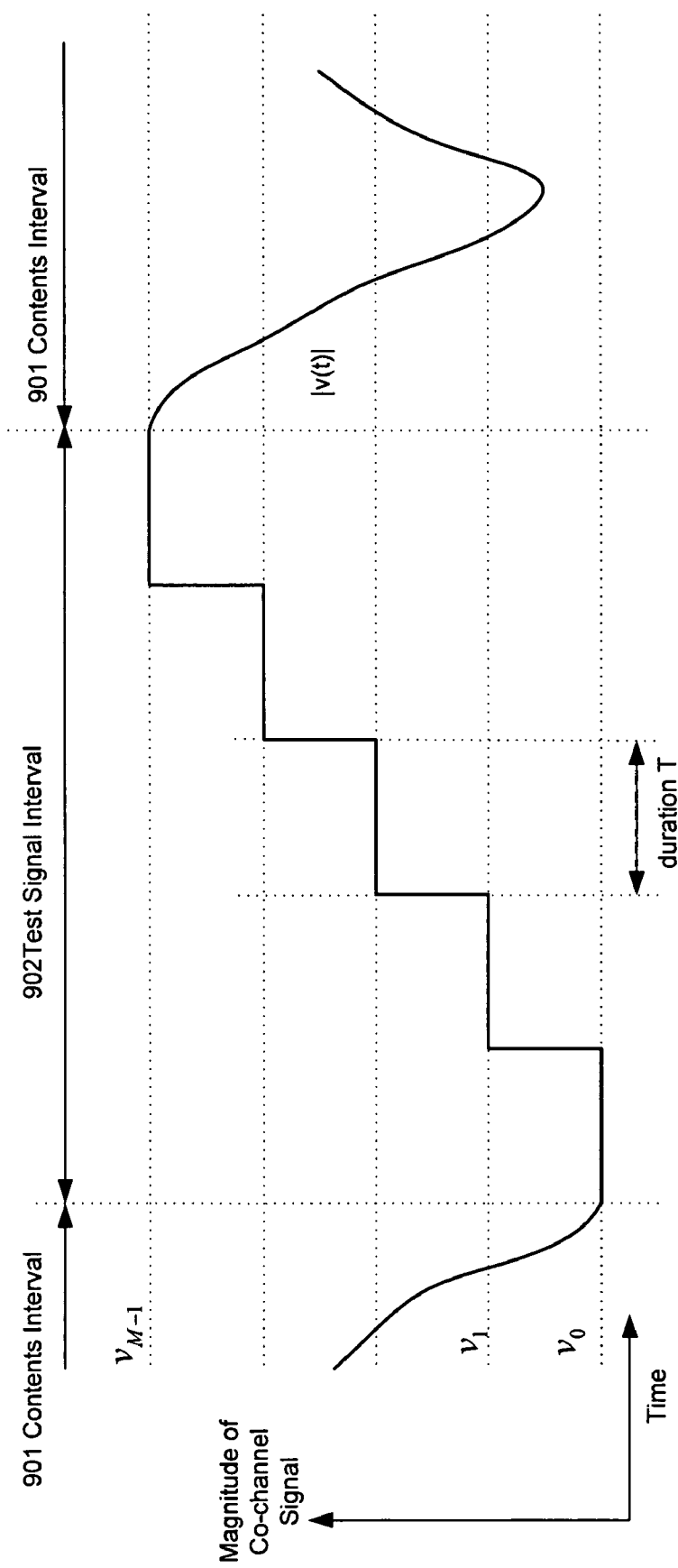
FIG. 9 illustrates magnitudes of co-channel signals during a test signal interval.

In this alternative embodiment for implementing the compensation estimator 107 and finding optimal compensation parameter vectors, the co-channel signal is assumed to contain a test signal interval in which the magnitude of the co-channel signal stays constant, for duration T, at each of certain values, as illustrated by interval 902 in FIG. 9. For example, some analog TV signals contain a test signal known as NTC7 composite which contains a signal interval similar to the signal described in FIG. 9. It is further assumed that the magnitude of the data signal is negligible enough, compared to co-channel signals, and that the data signal alone does not cause PA distortion.

The set of $\{v_0, v_1, \ldots v_{M-1}\}$ denotes constants at which the magnitude of the co-channel signal stays unchanged during a test signal interval. And the constant values are assumed to be diverse enough that the compensation parameter vectors can be interpolated from them. While the co-channel signal is fixed, the PA non-linear distortion can be modeled as an unknown complex-valued scalar channel, and using decision directed or trained LMS, this complex scalar distortion can be estimated.

Figure 7:
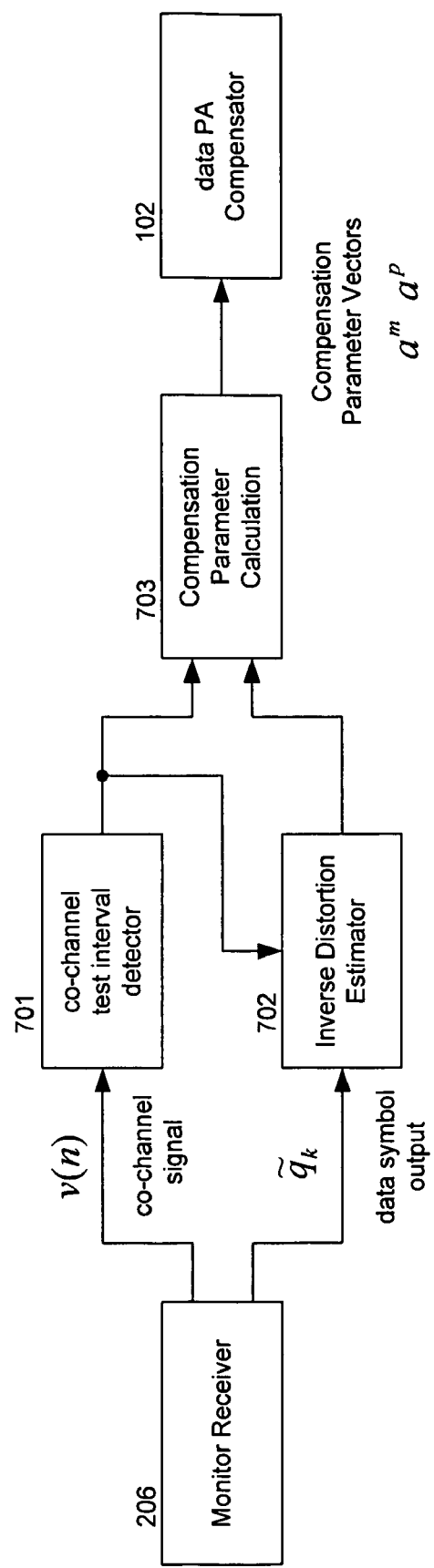

In FIG. 7, the co-channel test signal interval detector 701 detects the test signal interval from the co-channel output of the monitor receiver 106, $\tilde{v}(n)$, and enables an inverse distortion estimator 702 for only the test signal interval. The inverse distortion estimator 702 computes the inverse distortion for the value $v_k$ where $k=0, \ldots, M-1$, and wherein the computation can be performed by several different methods.

A first method to implement the inverse distortion estimator 702 is block estimation. The inverse distortion estimator 702 thus accumulates K symbol outputs when the test signal is at $v_k$ and computes the approximated minimum mean squared error (MMSE) inverse distortion, $\alpha(v_k)$, which attempts to minimize $E\|\tilde{q}_k - \alpha(v_k)D(\tilde{q}_k)\|^2$, by the following equation:

$$\alpha(v_k) = \frac{\sum_{n=0}^{K-1} \tilde{q}_n D(\tilde{q}_n)^*}{\sum_{n=0}^{K-1} |D(\tilde{q}_n)|^2},$$

where $z^*$ denotes the complex conjugate of z. As an alternative to the approximated MMSE inverse distortion the approximated zero forcing (ZF) inverse distortion can be considered, where:

$$\alpha(v_k) = \sum_{n=0}^{K-1} \frac{\tilde{q}_n}{D(\tilde{q}_n)}.$$

A second method to implement the inverse distortion estimator 702 is to adaptively update the inverse distortion, which is analogous to increasing the size of the block size K indefinitely. The inverse distortion obeying the follow update equation will converge to the MMSE inverse distortion:

$$\alpha(v_k)_{new} = \alpha(v_k)_{current} - \mu_\alpha(\tilde{q}_k - \alpha(v_k)_{current}D(\tilde{q}_k))D(\tilde{q}_k)^*,$$

where $\mu_\alpha$ is a step size.

Figure 10:
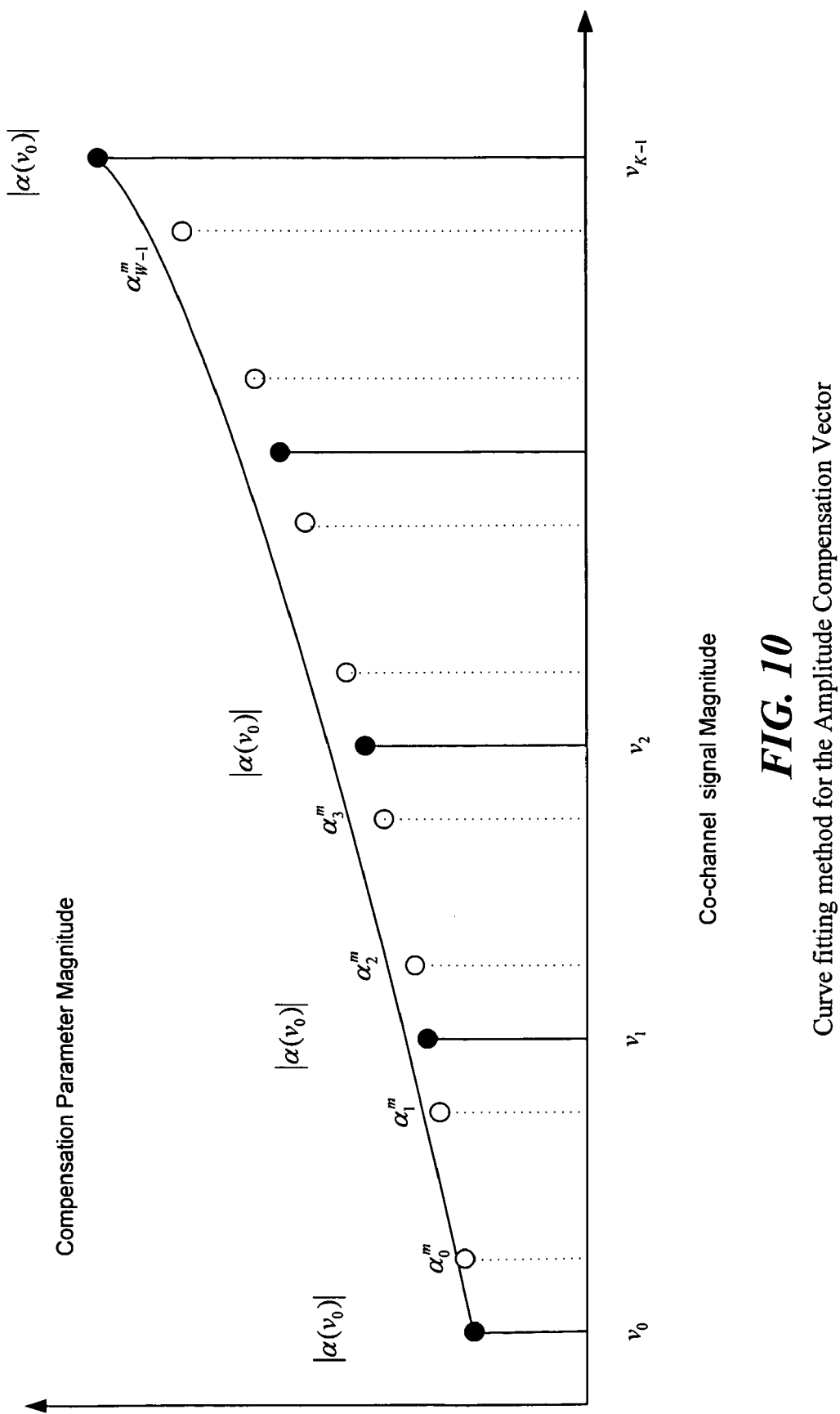
FIG. 10 illustrates a curve-fitting method for calculating compensation parameter vectors.

Once the inverse distortions $\{\alpha(v_k)\}$ are estimated for all $v_k$, the compensation parameter computation block 503 computes, from the set of $\{\alpha(v_k)\}$, compensation parameters based on a curve fitting. When the amplitude and phase calculation blocks 502 and 503 use the look up table approach, a polynomial (or piece-wise linear function) fitting $\{|\alpha(v_k)|\}$ in the MSE sense is computed and evaluated to obtain the compensation magnitude vector as illustrated in FIG. 10.

The same process with phases $\{\angle\alpha(v_k)\}$ produces compensation phase vectors. When the amplitude and phase calculation blocks 502 and 503 use the polynomial approach, a $(W-1)^{th}$ order polynomial fitting $\{|\alpha(v_k)|\}$ is computed and the compensation parameter vector is given by its coefficients.

Co-Channel Test signal Method with FSA—Compensation Estimator 3

Figure 8:
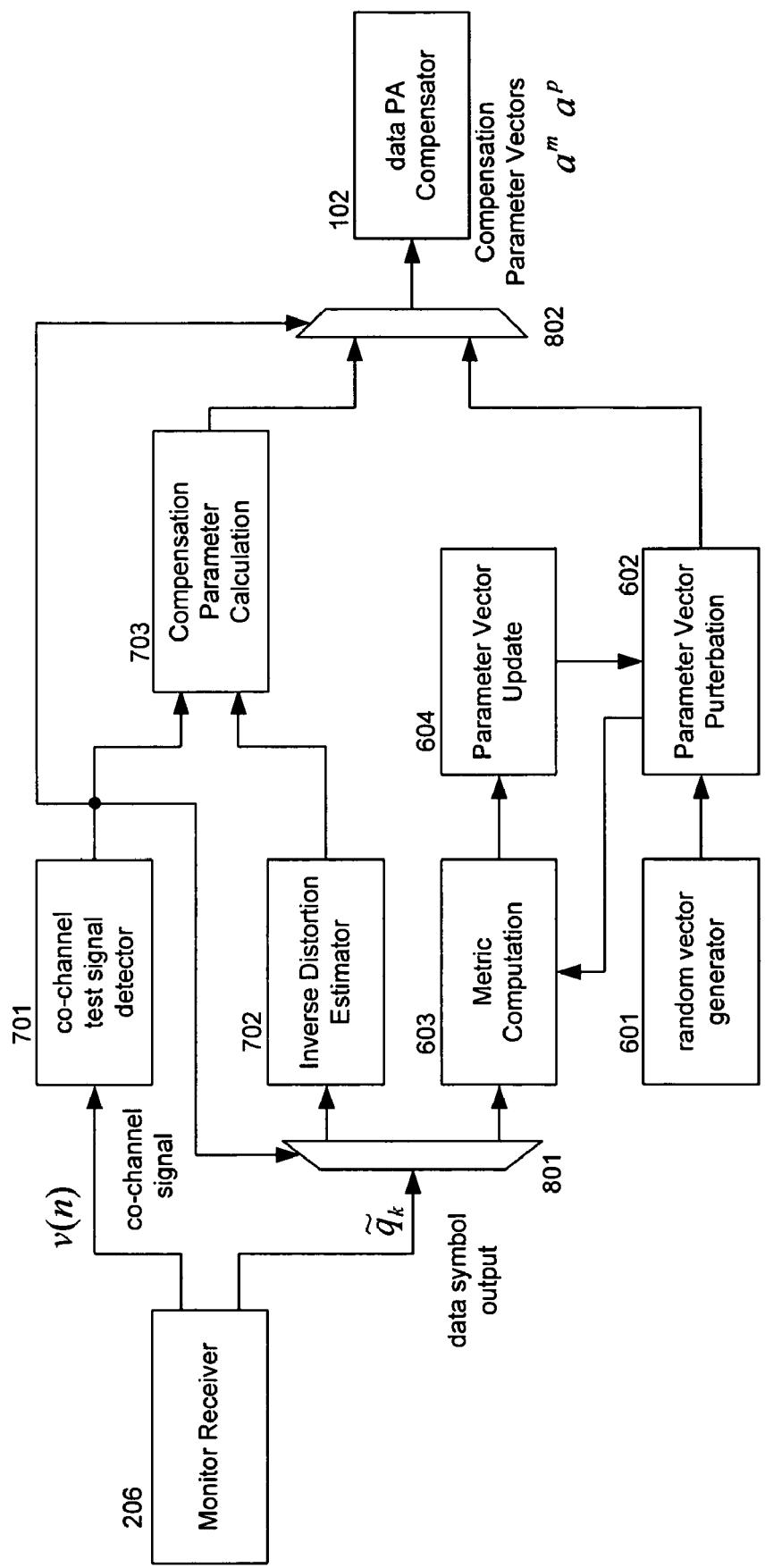

FIG. 8 describes a method that uses the Co-channel Test Signal Method for the test signal interval and uses the FSA for the rest of the signals, thus combining the above two methods. The co-channel test signal detector 701 detects the test signal interval of co-channel signal and controls multiplexers 801 and 802. During the test signal interval, the data symbol output is passed to the inverse distortion estimator 702, and the inverse distortion estimator block 702 and the compensation parameter computation block 703 generate compensation parameter vectors, as described in FIG. 7.

For the non-test signal interval, the symbol output is fed to the metric computation block 603 and the random vector generator 601, the parameter perturbation block 602, the metric computation block 603, and the parameter update block 604 generate compensation parameter vectors, as illustrated in FIG. 6.

Extensions

Embodiments of the invention can be extended to other systems. For example, the present non-linear compensation method, based on symbol error minimization, can be used against various non-linear distortions in digital communication systems. The embodiments and the attributes of the invention are not restricted to compensations for mitigating PA distortions.

Figure 11:
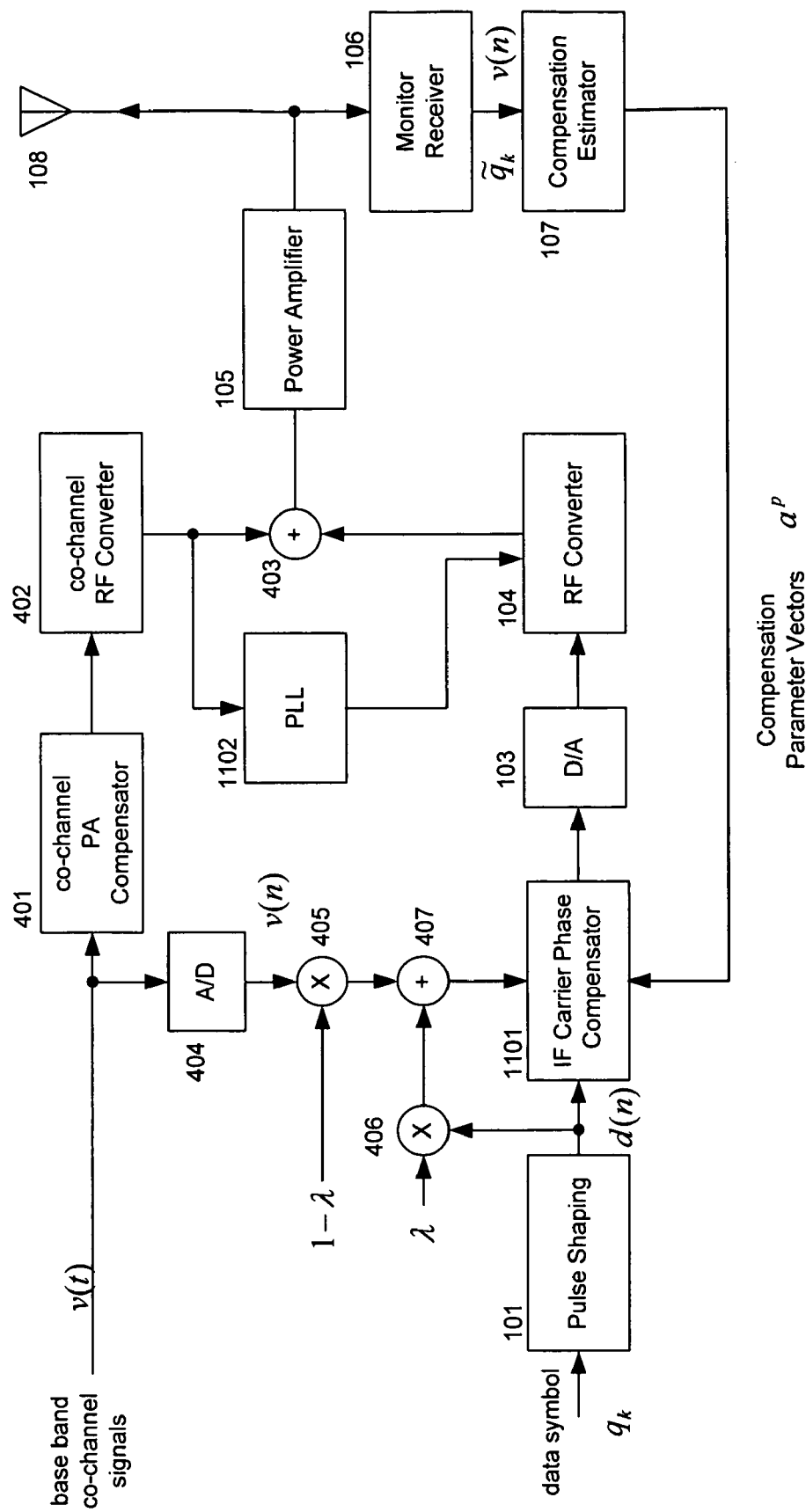
FIG. 11 illustrates an extension of an embodiment of the invention for compensation of a non-linear distortion caused by phase locked loop tracking error.

FIG. 11 illustrates an embodiment of the invention that is utilized to compensate a phase lock loop (PLL) tracking error, when the tracking error can be modeled as a non-linear function of the input signal envelope. The output of the co-channel RF converter block 402 is fed into a PLL 1102 to generate an RF carrier for the RF converter block 104. Assuming that the PLL 1102 exhibits tracking error as a function of the amplitude of the co-channel signal v(t), the tracking error induces a symbol error at the monitor receiver 106. The IF carrier phase compensator 1101 pre-compensates the phase error induced at the PLL 1102 with a parameter vector $a^p$. The optimal parameter is the one minimizing the symbol error rate, utilizing the methods disclosed herein.

Additionally, instead of symbol error rate, various received data signal quality metrics can be employed. For example, bit error rate (BER) of the received data or dispersion of the received data may be defined by:

$$J = E(|\tilde{q}_k|^2 - \gamma)^2,$$

where $\gamma$ is a constant. The Fittest Survivor Algorithm method is especially suitable for the BER metric, because FSA does not require any closed gradient of the BER function.

While specific circuitry may be employed to implement the above embodiments, aspects of the invention can be implemented in a suitable computing environment. Although not required, aspects of the invention may be implemented as computer-executable instructions, such as routines executed by a general-purpose computer, e.g., a server computer, wireless device or personal computer. Those skilled in the relevant art will appreciate that aspects of the invention can be practiced with other communications, data processing, or computer system configurations, including: Internet appliances, hand-held devices (including personal digital assistants (PDAs)), wearable computers, all manner of cellular or mobile phones, multi-processor systems, microprocessor-based or programmable consumer electronics, set-top boxes, network PCs, mini-computers, mainframe computers, and the like. Indeed, the terms "computer," "host," and "host computer" are generally used interchangeably herein, and refer to any of the above devices and systems, as well as any data processor.

Aspects of the invention can be embodied in a special purpose computer or data processor that is specifically programmed, configured, or constructed to perform one or more of the processes explained in detail herein. Aspects of the invention can also be practiced in distributed computing environments where tasks or modules are performed by remote processing devices, which are linked through a communications network, such as a Local Area Network (LAN), Wide Area Network (WAN), or the Internet. In a distributed computing environment, program modules may be located in both local and remote memory storage devices.

Aspects of the invention may be stored or distributed on computer-readable media, including magnetically or optically readable computer discs, hard-wired or preprogrammed chips (e.g., EEPROM semiconductor chips), nanotechnology memory, biological memory, or other data storage media. Indeed, computer implemented instructions, data structures, screen displays, and other data under aspects of the invention may be distributed over the Internet or over other networks (including wireless networks), on a propagated signal on a propagation medium (e.g., an electromagnetic wave(s), a sound wave, etc.) over a period of time, or they may be provided on any analog or digital network (packet switched, circuit switched, or other scheme). Those skilled in the relevant art will recognize that portions of the invention reside on a server computer, while corresponding portions reside on a client computer such as a mobile or portable device, and thus, while certain hardware platforms are described herein, aspects of the invention are equally applicable to nodes on a network.

The above detailed description of the embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways.

Also, while processes or blocks are at times shown as being performed in series, these processes or blocks may instead be performed in parallel, or may be performed at different times. Where the context permits, words in the above Detailed Description using the singular or plural number may also include the plural or singular number respectively.

The teachings provided herein can be applied to other systems, not necessarily the system described herein. The elements and acts of the various embodiments described above can be combined to provide further embodiments. All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

These and other changes can be made to the invention in light of the above Detailed Description. While the above description details certain embodiments of the invention and describes the best mode contemplated, no matter how detailed the above appears in text, the invention can be practiced in many ways. Details of the system may vary considerably in its implementation details, while still being encompassed by the invention disclosed herein.

Particular terminology used when describing certain features or aspects of the invention should not be taken to imply that the terminology is being redefined-herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, as well as the PCT Application entitled "Data Insertion Techniques for Expanding Information Capacity of Existing Communication Systems," filed Apr. 15, 2005, Ser. No. 11/578,479, assigned to Dotcast, and the U.S. Utility Patent Application entitled "Remote Antenna And Local Receiver Subsystems For Receiving Data Signals Carried Over Analog Television," filed April 18, 2005, Ser. No. 11/109,454, assigned to Dotcast, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. In a wireless data communication system, an apparatus for pre-compensating input data symbols to proactively mitigate distortions caused by signal amplification, the apparatus comprising:
   a pulse-shaping module configured to pulse-shape input data symbols;
   a compensator configured to adjust the pulse-shaped data symbols;
   a digital-to-analog converter configured to convert the adjusted data symbols to analog signals, wherein the compensator is coupled among the pulse-shaping module and the digital-to-analog converter;
   a radio frequency (RF) converter configured to convert the analog signals to RF signals;
   a power amplifier configured to amplify the RF signals for transmission;
   a monitor receiver configured to estimate data symbols based on the amplified RF signals; and
   a compensation estimator configured to compute a set of compensation parameters, based on the estimated data symbols, wherein the compensation estimator is coupled among the monitor receiver and the compensator, and wherein the compensator employs the set of compensation parameters for adjusting the data symbols; and,
   wherein the compensation estimator and compensator are configured to adaptively optimize compensation of the data symbols to minimize a mean square error (MSE) of adjusted data symbols with a stochastic update algorithm, where the algorithm repeatedly disturbs a compensation mapping in two opposite and random directions and chooses a direction minimizing the MSE until the MSE reaches a stable state at a local minimum.

2. In a wireless multi-source communication system transmitting a sum of data signals and co-channel analog signals, wherein the summed signals are amplified by a power amplifier, an apparatus for pre-compensating input data symbols to reduce non-linear distortions resulting from power amplification by the power amplifier, the apparatus comprising:
   a monitor receiver for demodulating the summed signals and producing estimated data symbols and estimated sampled co-channel signals;
   a compensation estimator for computing a set of compensation parameters for pre-compensating the input data symbols, wherein the computation of the compensation parameters is based on the estimated data symbols or the estimated data symbols and the estimated co-channel signals, and wherein the compensation parameters comprise:
      an amplitude parameter vector; and
      a phase parameter vector; and
   a pre-compensator for pre-compensating the input data symbols by multiplying the input data symbols by complex numbers generated from the compensation parameters and a combination of pulse-shaped data symbols and digitized co-channel signals;
   wherein the combination of pulse-shaped data symbols and digitized co-channel signals is $\lambda d(n)+(1-\lambda)v(n)$, where $d(n)$ is the pulse-shaped data, $v(n)$ is the digitized co-channel signal, and $0 \leq \lambda \leq 1$, and where $\lambda$ is adjustable for substantially optimal performance.

3. The apparatus of claim 2, wherein the pre-compensator reduces mean squared error (MSE) in output data symbols.

4. The apparatus of claim 2, wherein $\lambda$ is set to zero so that the pre-compensator operates solely based on the co-channel signal and the compensation parameters when co-channel signal power dominates the summed signal, and data signal changes have negligible effect on the power amplifier distortions.

5. The apparatus of claim 2, wherein the compensation estimator comprises:
   a random vector generator for generating a parameter vector filled with random numbers;
   a parameter vector perturbator for updating the parameter vector using the output of the random vector generator and indicating beginning of each perturbation to a metric calculator;

a metric calculator for accumulating a sum squared decision error for each perturbation, using the estimated data symbols from the monitor receiver; and a parameter vector updating facility for choosing parameter vectors resulting in a lower sum squared error and for determining a step size for next iteration, wherein with an updated parameter vector and a step size the parameter vector perturbator starts another iteration.

6. The apparatus of claim 5 wherein the compensator estimator generates compensation parameters during a test signal interval.

7. The apparatus of claim 2, wherein the compensation estimator comprises:
a configuration wherein the co-channel signal contains a test signal interval during which a magnitude of the co-channel signal stays at a constant value for a length of time and a magnitude of the data signal is negligible compared to the magnitude of the co-channel signal;
a co-channel test interval detector detecting the test signal interval by utilizing the estimated co-channel signal from the monitor receiver, and enabling an inverse distortion estimator only during the test signal interval;
an inverse distortion estimator computing an inverse distortion $\{\alpha(v_k)\}$ for magnitudes of the co-channel signals wherein the inverse distortion computation is performed by:
accumulating K symbol outputs when a test signal magnitude is at $v_k$ and computing an approximated minimum mean squared error inverse distortion or an approximated zero forcing inverse distortion; or
adaptively updating the inverse distortion; and
a compensation parameter calculator computing compensation parameters based on curve fitting, from the inverse distortions, once the inverse distortions are estimated for all $v_k$, the computation comprising:
a look up table, wherein amplitude and phase calculations use polynomial or piece-wise linear functions to obtain a compensation magnitude vector and a compensation phase vector; or
a polynomial computation, wherein a $(W-1)^{th}$ order polynomial fitting $\{|\alpha(v_k)|\}$ is computed and the compensation parameter vector is given by the polynomial coefficients, and wherein (W−1) is a length of the compensation parameter vectors.

8. The apparatus of claim 7 wherein the compensator estimator generates compensation parameters during a non-test signal interval.

9. In a communication network transmitting a combination of data and co-channel signals, a method for minimizing transmitted signal error by pre-adjusting input data to compensate for distortions resulting from signal amplification, the method comprising:
estimating the data signal, or the data and the co-channel signal, using amplified signals;
computing compensation parameters for pre-compensating the input data based on the estimated data, or the estimated data signal and estimated co-channel signal, wherein the parameters include:
an amplitude parameter vector $a^m = (a_0^m, \ldots a_{W-1}^m)$; and
a phase parameter vector $a^p = (a_0^p, \ldots a_{W-1}^p)$; and
pre-compensating the input data, wherein the pre-compensated input data is a function of the input data, compensation parameters, and the co-channel signals;
wherein pre-compensation of input data comprises:
computing an absolute value of a reference signal $x(n)$, where $x(n) = \lambda d(n) + (1-\lambda) v(n)$, $d(n)$ is pulse-shaped input data, $v(n)$ is digitized co-channel signal, $0 \leq \lambda \leq 1$, and where $\lambda$ is adjustable for optimal performance,
computing an amplitude value $m(|x(n)|)$ and a phase value $p(|x(n)|)$, wherein the computations comprise:
using a look-up table, where
$m(|x(n)|) = a_k^m$, $p(|x(n)|) = a_k^p$, with $T_k \leq |x(n)| < T_{k+1}$, and $\{T_k\}$ a partition of interval $[\min(|x(n)|), \max(|x(n)|)]$;
or
using polynominal functions, where $$m(|x(n)|) = \sum_{k=0}^{W-1} a_k^m |x(n)|^k, \quad p(|x(n)|) = \sum_{k=0}^{W-1} a_k^p |x(n)|^k;$$

transforming $m(|x(n)|)$ and $p(|x(n)|)$ to a complex number $m(|x(n)|)e^{jp(|x(n)|)}$;
multiplying the data signal $d(n)$ by the complex number $m(|x(n)|)e^{jp(|x(n)|)}$ to produce pre-compensated data $d(n) m(|x(n)|)e^{jp(|x(n)|)}$.

10. The method of claim 9, wherein the compensation parameter computation is an iterative process, and wherein the computation starts with initial parameter vectors $a^p(n)$ and $a^m(n)$ with n=0, the iterative process comprising:
generating a random vector $b(n)$, filled with random numbers, and with a same length as $a^m(n)$ and $a^p(n)$;
updating compensation parameter vectors by using the random vector $b(n)$ with each of the following four values for N data symbols:

|  | First N data Symbols | Second N data Symbols | Third N data Symbols | Fourth N data Symbols |
|---|---|---|---|---|
| Amplitude | $a^m(n) + \mu_n b(n)$ | $a^m(n) - \mu_n b(n)$ | $a^m(n)$ | $a^m(n)$ |
| Phase | $a^p(n)$ | $a^p(n)$ | $a^p(n) + \mu_n b(n)$ | $a^p(n) - \mu_k b(n)$ | where $\mu_n$ is a step size at an n-th iteration;
accumulating a sum squared decision error $J(n)$ using estimated data symbol $\tilde{q}_k$ for the N symbols, for each perturbation, where $$J_{m+}(n) = \sum_{k=0}^{N-1} |\tilde{q}_k - D(\tilde{q}_k)|^2 \text{ (for the first } N \text{ data Symbols)}$$

$$J_{m-}(n) = \sum_{k=N}^{2N-1} |\tilde{q}_k - D(\tilde{q}_k)|^2 \text{ (for the second } N \text{ data Symbols)}$$

$$J_{p+}(n) = \sum_{k=2N}^{3N-1} |\tilde{q}_k - D(\tilde{q}_k)|^2 \text{ (for the third } N \text{ data Symbols)}$$

$$J_{p-}(n) = \sum_{k=3N}^{4N-1} |\tilde{q}_k - D(\tilde{q}_k)|^2 \text{ (for the fourth } N \text{ data Symbols)}$$

and where $D(\tilde{q}_k)$ denotes a hard decision value based on the estimated data $\tilde{q}_k$ or based on an originally sent symbol obtained from a training sequence;
choosing parameter vectors resulting in a lower sum squared error employing four metrics $J_{m+}(n), J_{m-}(n), J_{p+}(n), J_{p-}(n)$, where:

$$a^m(n+1) = \begin{cases} a^m(n) + \mu_n b(n) & \text{if } J_{m+}(n) < J_{m-}(n) \\ a^m(n) - \mu_n b(n) & \text{if } J_{m+}(n) \geq J_{m-}(n) \end{cases}$$

$$a^p(n+1) = \begin{cases} a^p(n) + \mu_n b(n) & \text{if } J_{p+}(n) < J_{p-}(n) \\ a^p(n) - \mu_n b(n) & \text{if } J_{p+}(n) \geq J_{p-}(n) \end{cases}$$

determining a step size for a next iteration by:

$\mu_{n+1} = \mu_n f_\mu(|J_{m+}(n) - J_{m-}(n)|, |J_{p+}(n) - J_{p-}(n)|)$, where $f_\mu$ is a step size scale function; and
starting the next iteration using updated parameter vectors and the step size.

11. The method of claim 9, wherein the compensation parameter computation comprises:
a configuration wherein:
the co-channel signal contains a test signal interval during which magnitude of the co-channel signal stays at a constant value for a duration of t; and
magnitude of the data signal is so negligible compared to the magnitude of the co-channel signal that the data signal alone does not cause power amplifier distortion;
a co-channel test interval detector detecting the test signal interval by utilizing the estimated co-channel signal, and enabling an inverse distortion estimator only during the test signal interval;
an inverse distortion estimator computing an inverse distortion for magnitudes of the co-channel signals wherein the computation of the inverse distorsion is performed by:
accumulating K symbol outputs when the test signal is at $v_k$, and computing an approximated minimum mean squared error (MMSE) inverse distortion, $\alpha(v_k)$, which attempts to minimize $E\|\tilde{q}_k - \alpha(v_k) D(\tilde{q}_k)\|^2$, comprising:

$$\alpha(v_k) = \frac{\sum_{n=0}^{K-1} \tilde{q}_n D(\tilde{q}_n)^*}{\sum_{n=0}^{K-1} |D(\tilde{q}_n)|^2},$$

where z* is complex conjugate of z, and wherein as an alternative to the approximated MMSE inverse distortion an approximated zero forcing (ZF) inverse distortion may be considered such that:

$$\alpha(v_k) = \sum_{n=0}^{K-1} \frac{\tilde{q}_n}{D(\tilde{q}_n)};$$

or
adaptively updating the inverse distortion, where the inverse distortion obeying the follow update equation will converge to the MMSE inverse distortion:

$\alpha(v_k)_{new} = \alpha(v_k)_{current} - \mu_\alpha (\tilde{q}_k - \alpha(v_k)_{current} D(\tilde{q}_k)) D(\tilde{q}_k)^*$, where $\mu_\alpha$ is a step size; and
a compensation parameter calculator computing compensation parameters based on curve fitting, using inverse distortions, once the inverse distortions $\{\alpha(v_k)\}$ are estimated for all $v_k$, the computation comprising:

a look up table, wherein amplitude and phase calculations use polynomial or piece-wise linear functions fitting $\{|\alpha(v_k)|\}$ in a mean square error (MSE) sense to obtain the compensation magnitude parameter vector, and wherein a same process is performed with phases $\{\angle\alpha(v_k)\}$ to produce a compensation phase parameter vector; or a polynomial computation, wherein a $(W-1)^{th}$ order polynomial fitting $\{|\alpha(v_k)|\}$ is computed and the compensation parameter vector is given by the polynomial coefficients, and wherein a same process is performed with phases $\{\angle\alpha(v_k)\}$ to produce a compensation phase vector, where $(W-1)$ is a length of the compensation parameter vectors.

12. In a wireless data communication system, an apparatus for pre-compensating input data symbols to proactively mitigate distortions caused by signal amplification, the apparatus comprising:
a pulse-shaping module configured to pulse-shape input data symbols;
a compensator configured to adjust the pulse-shaped data symbols;
a digital-to-analog converter configured to convert the adjusted data symbols to analog signals, wherein the compensator is coupled among the pulse-shaping module and the digital-to-analog converter;
a radio frequency (RF) converter configured to convert the analog signals to RF signals;
a power amplifier configured to amplify the RF signals for transmission;
a monitor receiver configured to estimate data symbols based on the amplified RF signals; and
a compensation estimator configured to compute a set of compensation parameters, based on the estimated data symbols, wherein the compensation estimator is coupled among the monitor receiver and the compensator, and wherein the compensator employs the set of compensation parameters for adjusting the data symbols; and,
wherein the compensation estimator is configured to determine, by least-mean-square (LMS) single parameter estimation, distortion coefficients for minimizing mean square error (MSE) of the adjusted data symbols, and after determining the distortion coefficients, sequentially, for each of multiple fixed co-channel signal values, to interpolate a distortion mapping.

13. In a wireless data communication system, an apparatus for pre-compensating input data symbols to proactively mitigate distortions caused by signal amplification, the apparatus comprising:
a pulse-shaping module configured to pulse-shape input data symbols;
a compensator configured to adjust the pulse-shaped data symbols;
a digital-to-analog converter configured to convert the adjusted data symbols to analog signals, wherein the compensator is coupled among the pulse-shaping module and the digital-to-analog converter;
a radio frequency (RF) converter configured to convert the analog signals to RF signals;
a power amplifier configured to amplify the RE signals for transmission;
a monitor receiver configured to estimate data symbols based on the amplified RE signals; and
a compensation estimator configured to compute a set of compensation parameters, based on the estimated data symbols, wherein the compensation estimator is coupled among the monitor receiver and the compensator, and wherein the compensator employs the set of compensation parameters for adjusting the data symbols; and, wherein the compensation estimator determines pre-distortion coefficients for minimizing output data symbol mean square error (MSE) in the adjusted data symbols by:

a least-mean-square (LMS) type single parameter estimation, wherein after sequentially determining the pre-distortion coefficients for each of multiple fixed co-channel signal values, pre-distortion mapping is interpolated, and wherein co-channel signals have a known test signal interval in which co-channel signals stay constant at various fixed values; or a stochastic update algorithm, wherein the algorithm repeatedly disturbs the pre-distortion mapping in two opposite and random directions and chooses the direction minimizing the MSE until the MSE reaches a stable state at a local minimum.

14. In a wireless multi-source communication system transmitting a sum of data signals and co-channel analog signals, wherein the summed signals are amplified by a power amplifier, an apparatus for pre-compensating input data symbols to reduce non-linear distortions resulting from power amplification by the power amplifier, the apparatus comprising:

a monitor receiver for demodulating the summed signals and producing estimated data symbols and estimated sampled co-channel signals:

a compensation estimator for computing a set of compensation parameters for pre-compensating the input data symbols, wherein the computation of the compensation parameters is based on the estimated data symbols or the estimated data symbols and the estimated co-channel signals, and wherein the compensation parameters comprise:

an amplitude parameter vector; and a phase parameter vector; and a pre-compensator for pre-compensating the input data symbols by multiplying the input data symbols by complex numbers generated from the compensation parameters and a combination of pulse-shaped data symbols and digitized co-channel signals;

wherein pre-compensation of the data symbols comprises:

computing the absolute value of the combination of pulse-shaped data symbols and digitized co-channel signals;

calculating an amplitude value based on the computed absolute value and amplitude parameters from the amplitude parameter vector;

calculating a phase value based on the computed absolute value and phase parameters from the phase parameter vector;

forming a complex number using the amplitude value and the phase value; and multiplying the input data symbols by the complex number.

15. The apparatus of claim 14, wherein calculating the amplitude and phase values comprises:

a look-up table having the elements of the parameter vectors directly approximate the pre-compensation function with a quantization grid; or a polynomial calculator, where the elements of the parameter vectors are used as coefficients of a high order polynomial approximating the pre-compensation function.

* * * * *